(12) United States Patent
Chiba et al.

(10) Patent No.: US 7,781,142 B2
(45) Date of Patent: Aug. 24, 2010

(54) COPOLYMER AND TOP COATING COMPOSITION

(75) Inventors: Takashi Chiba, Tokyo (JP); Toru Kimura, Tokyo (JP); Tomohiro Utaka, Tokyo (JP); Hiroki Nakagawa, Tokyo (JP); Hirokazu Sakakibara, Tokyo (JP); Hiroshi Dougauchi, Tokyo (JP)

(73) Assignee: JSR Corporation, Tokyo (JP)

( * ) Notice: Subject to any disclaimer, the term of this patent is extended or adjusted under 35 U.S.C. 154(b) by 4 days.

(21) Appl. No.: 11/664,296

(22) PCT Filed: Sep. 28, 2005

(86) PCT No.: PCT/JP2005/017790

§ 371 (c)(1),
(2), (4) Date: Mar. 29, 2007

(87) PCT Pub. No.: WO2006/035790

PCT Pub. Date: Apr. 6, 2006

(65) Prior Publication Data

US 2008/0038661 A1   Feb. 14, 2008

(30) Foreign Application Priority Data

Sep. 30, 2004 (JP) ............................. 2004-287724
Apr. 27, 2005 (JP) ............................. 2005-130557

(51) Int. Cl.
*G03F 7/11* (2006.01)
*C08F 18/20* (2006.01)
*C08F 18/22* (2006.01)

(52) U.S. Cl. ................. 430/270.1; 430/273.1; 526/245; 526/288

(58) Field of Classification Search .............. 430/270.1, 430/271.1, 273.1; 526/245, 288; 525/326.2
See application file for complete search history.

(56) References Cited

U.S. PATENT DOCUMENTS

| | | | |
|---|---|---|---|
| 2,728,749 A | | 12/1955 | Coover, Jr. et al. |
| 4,554,298 A * | | 11/1985 | Farrar et al. .................. 523/336 |
| 4,640,942 A * | | 2/1987 | Brothers ...................... 523/130 |
| 5,225,311 A * | | 7/1993 | Nakano et al. ............... 430/190 |
| 5,693,447 A * | | 12/1997 | Takeyama et al. ........... 430/201 |
| 6,333,133 B1 * | | 12/2001 | Nakamura et al. ....... 430/270.1 |
| 6,784,312 B2 | | 8/2004 | Miyazawa et al. .......... 560/205 |
| 6,991,890 B2 | | 1/2006 | Li et al. .................... 430/270.1 |
| 7,063,931 B2 | | 6/2006 | Li et al. .................... 430/270.1 |
| 2002/0051929 A1 * | | 5/2002 | Watanabe et al. ........... 430/192 |
| 2003/0078352 A1 | | 4/2003 | Miyazawa et al. .......... 526/245 |
| 2004/0024156 A1 | | 2/2004 | Quadir et al. |
| 2004/0161698 A1 * | | 8/2004 | Kanagasabapathy et al. ........................ 430/270.1 |
| 2004/0236046 A1 | | 11/2004 | Miyazawa et al. .......... 526/245 |
| 2005/0058930 A1 * | | 3/2005 | Li et al. .................... 430/270.1 |
| 2005/0101727 A1 | | 5/2005 | Amalric et al. |
| 2005/0153232 A1 | | 7/2005 | Li et al. .................... 430/270.1 |
| 2005/0175928 A1 | | 8/2005 | Li et al. .................... 430/270.1 |
| 2005/0202351 A1 * | | 9/2005 | Houlihan et al. ............ 430/322 |
| 2005/0233254 A1 * | | 10/2005 | Hatakeyama et al. ....... 430/311 |
| 2006/0216643 A1 | | 9/2006 | Li et al. .................... 430/270.1 |
| 2006/0234154 A1 | | 10/2006 | Nishimura et al. ....... 430/270.1 |

FOREIGN PATENT DOCUMENTS

| | | |
|---|---|---|
| AU | 2003296188 A1 | 12/2003 |
| EP | 1602975 A1 | 12/2005 |
| FR | 2852258 A | 9/2004 |
| JP | 10-221852 | 8/1998 |
| JP | 11-176727 | 7/1999 |
| JP | 2003-040840 | 2/2003 |
| JP | 2003-173022 | 6/2003 |
| JP | 2004-220009 | 8/2004 |
| JP | 2005-196209 | 7/2005 |
| JP | 2005-222059 | 8/2005 |
| KR | 1020030011581 A | 2/2003 |
| TW | 593274 B | 6/2004 |
| WO | WO 95/30794 | 11/1995 |
| WO | 2004/061525 A1 | 7/2004 |

OTHER PUBLICATIONS

List of Polyester Urethane—Toyobo Vylon Dept., 2005.*

* cited by examiner

*Primary Examiner*—Cynthia H Kelly
*Assistant Examiner*—Anca Eoff
(74) *Attorney, Agent, or Firm*—Ditthavong Mori & Steiner, P.C.

(57) ABSTRACT

A resin composition for forming a top coat which can be formed on a photoresist film without causing intermixing with the photoresist film, can maintain a stable film coating which is not eluted into a medium during immersion lithography, does not impair pattern profiles during dry exposure (which is not immersion lithography), and can be easily dissolved in an alkaline developer. The resin is a copolymer which comprises at least one recurring unit (I) selected from the group consisting of a recurring unit having a group shown by the following formula (1), a recurring unit having a group shown by the following formula (2), and a recurring unit having a carboxyl group, and a recurring unit (II) having a sulfo group, the copolymer having a weight average molecular weight determined by gel permeation chromatography of 2,000 to 100,000,

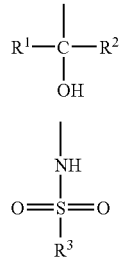

wherein at least one of $R^1$ and $R^2$ is a fluoroalkyl group having 1 to 4 carbon atoms and $R^3$ in the formula (2) represents a fluoroalkyl group having 1 to 20 carbon atoms.

9 Claims, 1 Drawing Sheet

[Fig. 1]
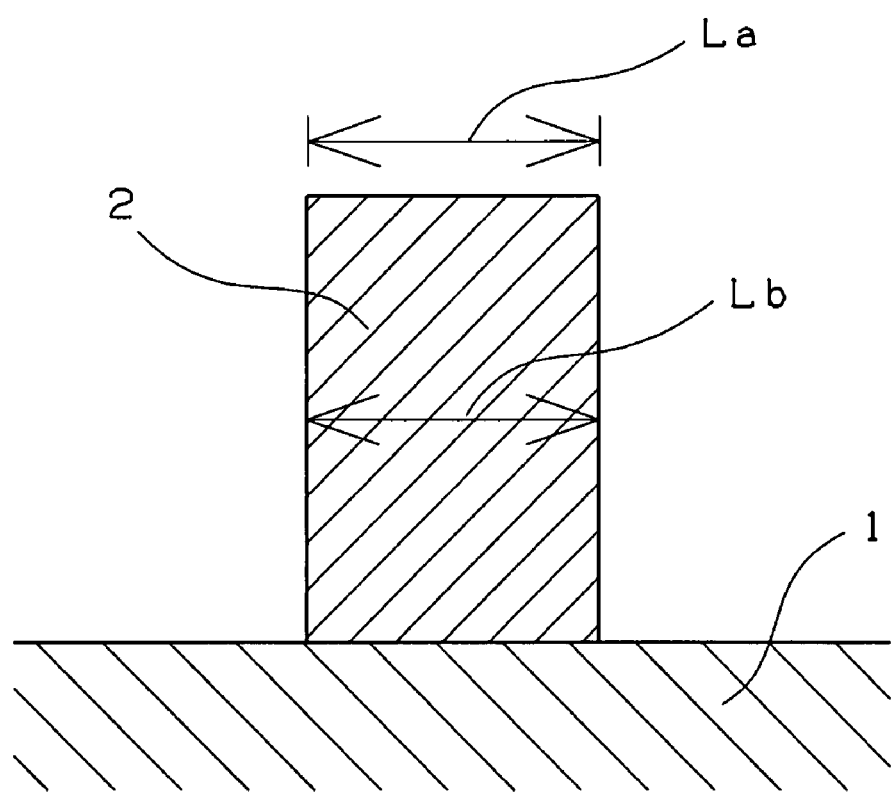

COPOLYMER AND TOP COATING COMPOSITION

TECHNICAL FIELD

The present invention relates to a novel copolymer and a top coating composition on a photoresist film in which the copolymer is used. In particular, the present invention relates to a top coating composition for liquid immersion useful for forming a top coat which protects a photoresist film during immersion lithography for miniaturizing lithography and protects the lens of a projection exposure device (projection aligner) by suppressing elution of photoresist components, and to a copolymer used in the composition.

BACKGROUND ART

In the manufacture of semiconductor devices and the like, a stepping or step-and-scan projection aligner has been used in which a pattern of a reticle (photomask) is transferred onto each shot region on a wafer coated with a photoresist through a projection optical system.

The resolution of the projection optical system provided in the projection aligner increases as the exposure wavelength used becomes shorter and the numerical aperture of the projection optical system becomes greater. Therefore, the exposure wavelength which is a wavelength of radiation used in the projection aligner has been reduced along with scaling down of integrated circuits year by year, and the numerical aperture of the projection optical system has also been increased.

In addition to the resolution, the depth of focus is also important for exposure. The resolution R and the depth of focus δ are respectively shown by the following formulas.

$$R = k1 \cdot \lambda / NA \quad \text{(i)}$$

$$\delta = k2 \cdot \lambda / NA^2 \quad \text{(ii)}$$

wherein λ is the exposure wavelength, NA is the numerical aperture of the projection optical system, and k1 and k2 are process coefficients. When obtaining the same resolution R, a larger depth of focus δ is obtained by using radiation with a shorter wavelength.

A photoresist film is formed on the surface of an exposure target wafer, and the pattern is transferred to the photoresist film. In a conventional projection aligner, the space in which the wafer is placed is filled with air or nitrogen. When the space between the wafer and the lens of the projection aligner is filled with a medium having a refractive index of n, the resolution R and the depth of focus δ are shown by the following formulas.

$$R = k1 \cdot (\lambda/n)/NA \quad \text{(iii)}$$

$$\delta = k2 \cdot n\lambda / NA^2 \quad \text{(iv)}$$

For example, when using water as the above medium in the ArF process, since water has a refractive index n for light with a wavelength of 193 nm of 1.44, the resolution R is 69.4% ($R = k1 \cdot (\lambda/1.44)/NA$) and the depth of focus is 144% ($\delta = k2 \cdot 1.44\lambda/NA^2$) of the values during exposure using air or nitrogen as the medium.

Such a projection exposure method in which the wavelength of exposure radiation is reduced to transfer a more minute pattern is called a immersion lithography. The immersion lithography is considered to be an essential technology for lithography with reduced dimensions, particularly for lithography with dimensions of several ten nanometers. A projection aligner used for the method is known (see Patent Document 1).

In the immersion lithography, a photoresist film applied and formed on a wafer and the lens of the projection aligner respectively come into contact with a medium with a refractive index n. If water is used as a medium, for example, water may permeate the photoresist film and reduces the photoresist resolution. In addition, the components forming the photoresist may be eluted into the water and may pollute the surface of the lens of the projection aligner.

A method of forming a top coat on the photoresist film in order to shut-off the photoresist film from a medium such as water has been proposed. Such a top coat must possess sufficient transmittance to the wavelength of radiation, must be formed on the photoresist film without causing intermixing with the photoresist film, must maintain a stable film which is not eluted into the medium during immersion lithography, and must easily dissolve in an alkaline solution used as a developer.

Moreover, a resist designed for use in a normal dry environment must be used as a liquid immersion resist as is. In order to provide such a resist film, a top coat for liquid immersion that can protect the resist film from an immersion liquid without degrading its performance originally designed for use under dry conditions is necessary.

[Patent Document 1] JP-A-11-176727

DISCLOSURE OF THE INVENTION

Problems to be Solved by the Invention

The present invention has been achieved in order to accomplish this object and provides a top coating resin composition and a copolymer used for the composition that can exhibit sufficient transmittance to the exposure wavelength, particularly a wavelength of 193 nm (ArF), can be applied on a photoresist film without causing intermixing with the photoresist film, can maintain a stable film which is not eluted into the medium during immersion lithography, can increase adhesion with a wafer at the edges, does not impair pattern profiles during dry exposure (not immersion lithography), and can be easily dissolved in an alkaline developer.

Means for Solving the Problems

The copolymer of the present invention comprises at least one recurring unit (I) selected from the group consisting of a recurring unit having a group shown by the following formula (1), a recurring unit having a group shown by the following formula (2), and a recurring unit having a carboxyl group, and a recurring unit (II) having a sulfo group, and has a weight average molecular weight determined by gel permeation chromatography of 2,000 to 100,000.

(1)

-continued

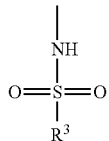
(2)

wherein $R^1$ and $R^2$ in the formula (1) individually represent a hydrogen atom, an alkyl group having 1 to 4 carbon atoms, or a fluoroalkyl group having 1 to 4 carbon atoms, provided that at least one of $R^1$ and $R^2$ is a fluoroalkyl group having 1 to 4 carbon atoms, and $R^3$ in the formula (2) represents a fluoroalkyl group having 1 to 20 carbon atoms.

In the above copolymer of the present invention, the monomer producing the recurring unit (II) having a sulfo group is a compound shown by the following formula (3),

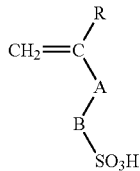
(3)

wherein R represents a hydrogen atom, a methyl group, a hydroxymethyl group, or a trifluoromethyl group, A represents a single bond, a carbonyl group, a carbonyloxy group, an oxy carbonyl group, and B represents a single bond or a divalent organic group having 1 to 20 carbon atoms.

The top coating composition of the present invention is a composition to be applied to a photoresist film for forming patterns by radiation and comprises a resin dissolvable in a developer dissolved in a solvent containing a monohydric alcohol. And the resin is the copolymer of the present invention.

EFFECT OF THE INVENTION

The copolymer of the present invention comprises at least one recurring unit (I) selected from the group consisting of a recurring unit having a group shown by the above-mentioned formula (1), a recurring unit having a group shown by the above-mentioned formula (2), and a recurring unit having a carboxyl group, and a recurring unit (II) having a sulfo group. The copolymer is dissolvable in a solvent containing a monohydric alcohol as well as in an alkaline developer.

Because the composition for forming the top coat of the present invention comprises a copolymer resin dissolvable in a developer dissolved in a solvent containing a monohydric alcohol, the composition can be easily applied to a photoresist film. The top coat can protect a lens and a resist and can form a resist pattern excelling in resolution, developability, and the like in immersion lithography, particularly in immersion lithography using water as a medium.

The composition can also be used in a dry method in which a liquid is not used for exposure. In addition, the composition can produce a top coat for liquid immersion that can protect a resist film originally designed for use under dry conditions from an immersion liquid without degrading the performance of the resist film.

Therefore, the composition can be extremely suitably used for manufacturing semiconductor devices, which are expected to become more and more minute.

BEST MODE FOR CARRYING OUT THE INVENTION

The resin constituting the top coating composition of the present invention can form a coating stable in a medium such as water during exposure to radiation in immersion lithography and is dissolvable in the developer for forming resist patterns.

"A coating stable in a medium such as water during exposure to radiation" indicates a coating in which the film thickness change when measured by a stability evaluation method in water mentioned later, for example, is not more than 3% of the initial film thickness. "Dissolvable in the developer after forming resist patterns" indicates the properties of a resin in which a top coat made from the resin can be removed without leaving a residue on the resist pattern when visually inspected after development using an alkaline aqueous solution. That is, the resin of the present invention is an alkali-soluble resin which is scarcely dissolved in media such as water, but dissolved in an alkaline aqueous solution during development using the alkaline aqueous solution after exposure to radiation.

A top coat made from such an alkali-soluble resin can prevents a photoresist film from directly coming into contact with a medium such as water during immersion lithography, prevents deterioration of lithographic performance of the photoresist film due to penetration of the medium, and protects the lens of the projection aligner from being polluted with components eluted from the photoresist film.

The recurring unit (I) of the copolymer of the present invention is expressed by a recurring unit having a group shown by the formula (1), a recurring unit having a group shown by the formula (2), the recurring unit having a carboxyl group, a recurring unit having all of these recurring units, or a recurring unit having any two recurring units among these recurring units.

In the recurring unit having a group shown by the formula (1), as examples of the alkyl group having 1 to 4 carbon atoms, a methyl group, ethyl group, propyl group, and butyl group can be given; and as examples of the fluoroalkyl group having 1 to 4 carbon atoms, a difluoro methyl group, perfluoromethyl group, 2,2-difluoroethyl group, 2,2,2-trifluoroethyl group; perfluoroethyl group, 2,2,3,3-tetrafluoropropyl group, perfluoroethylmethyl group, perfluoropropyl group, 2,2,3,3,4,4-hexafluorobutyl group, perfluorobutyl group, 1,1-dimethyl-2,2,3,3-tetrafluoropropyl group, and the like can be given.

Of these groups, the perfluoromethyl group is preferable.

The recurring unit having the group shown by the formula (1) has an alcoholic hydroxyl group on the side chain and the alcoholic hydroxyl group contains at least one fluoroalkyl group at least on the α-position and causes the compound to exhibit acidity in an aqueous solution, because the hydrogen atom is easily dissociated from the alcoholic hydroxyl group due to electron-attracting properties of the fluoroalkyl group, particularly, the perfluoromethyl group. For this reason, the resin is soluble in alkali, but insoluble in pure water.

As preferable examples of the recurring unit having a group shown by the formula (1), the recurring unit of the following formula (1a) can be given.

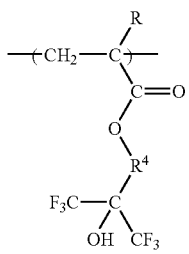

(1a)

wherein R is the same as R in the formula (3) and $R^4$ represents an organic group, preferably a divalent hydrocarbon group. Chain hydrocarbon groups and cyclic hydrocarbon groups are preferable among the divalent hydrocarbon group.

As preferable examples of $R^4$, saturated linear hydrocarbon groups such as a methylene group, ethylene group, propylene group (1,3-propylene group, 1,2-propylene group), tetramethylene group, pentamethylene group, hexamethylene group, heptamethylene group, octamethylene group, nonamethylene group, decamethylene group, undecamethylene group, dodecamethylene group, tridecamethylene group, tetradecamethylene group, pentadecamethylene group, hexadecamethylene group, heptadecamethylene group, octadecamethylene group, nonadecamethylene group, icosylene group, 1-methyl-1,3-propylene group, 2-methyl-1,3-propylene group, 2-methyl-1,2-propylene group, 1-methyl-1,4-butylene group, 2-methyl-1,4-butylene group, methylidene group, ethylidene group, propylidene group, and 2-propylidene group; monocyclic hydrocarbon groups such as cycloalkylene groups having 3 to 10 carbon atoms such as cyclobutylene groups (e.g. a 1,3-cyclobutylene group), cyclopentylene groups (e.g. a 1,3-cyclopentylene group), cyclohexylene groups (e.g. a 1,4-cyclohexylene group), and cyclooctylene groups (e.g. a 1,5-cyclooctylene group); bridged cyclic hydrocarbon groups such as cyclic hydrocarbon groups with 2 to 4 rings having 4 to 30 carbon atoms such as norbornylene groups (e.g. 1,4-norbornylene group, 2,5-norbornylene group), and adamantylene groups (e.g. 1,5-adamantylene group, 2,6-adamantylene group); and the like can be given.

Particularly when the $R^4$ is a divalent alicyclic hydrocarbon group, it is preferable to insert an alkylene group having 1 to 4 carbon atoms as a spacer between a bis(trifluoromethyl)hydroxymethyl group and the alicyclic hydrocarbon group.

In the formula (1a), $R^4$ is preferably a hydrocarbon group containing a 2,5-norbornylene group or 2,6-norbornylene group, or a 1,2-propylene group.

In the recurring unit having a group shown by the formula (2), as the fluoroalkyl group having 1 to 20 carbon atoms represented by $R^3$, fluoroalkyl groups having 1 to 20 carbon atoms such as a difluoromethyl group, perfluoromethyl group, 2,2-difluoroethyl group, 2,2,2-trifluoroethyl group, perfluoroethyl group, 2,2,3,3-tetrafluoropropyl group, perfluoroethylmethyl group, perfluoropropyl group, 2,2,3,3,4,4-hexafluorobutyl group, perfluorobutyl group, 1,1-dimethyl-2,2,3,3-tetrafluoropropyl group, 1,1-dimethyl-2,2,3,3,3-pentafluoropropyl group, 2-(perfluoropropyl)ethyl group, 2,2,3,3,4,4,5,5-octafluoropentyl group, perfluoropentyl group, 1,1-dimethyl-2,2,3,3,4,4-hexafluorobutyl group, 1,1-dimethyl-2,2,3,3,4,4,4-heptafluorobutyl group, 2-(perfluorobutyl)ethyl group, 2,2,3,3,4,4,5,5,6,6-decafluorohexyl group, perfluoropentylmethyl group, perfluorohexyl group, 1,1-dimethyl-2,2,3,3,4,4,5,5-octafluoropentyl group, 1,1-dimethyl-2,2,3,3,4,4,5,5,5-nonafluoropentyl group, 2-(perfluoropentyl)ethyl group, 2,2,3,3,4,4,5,5,6,6,7,7-dodecafluoroheptyl group, perfluorohexylmethyl group, perfluoroheptyl group, 2-(perfluorohexyl)ethyl group, 2,2,3,3,4,4,5,5,6,6,7,7,8,8-tetra-decafluorooctyl group, perfluoroheptylmethyl group, perfluorooctyl group, 2-(perfluoroheptyl)ethyl group, 2,2,3,3,4,4,5,5,6,6,7,7,8,8,9,9-hexadecafluorononyl group, perfluorooctylmethyl group, perfluorononyl group, 2-(perfluorooctyl)ethyl group, 2,2,3,3,4,4,5,5,6,6,7,7,8,8,9,9,10,10-octadecafluorodecyl group, perfluorononylmethyl group, perfluorodecyl group, 2,2,3,3,4,4,4-hexafluorobutyl group, 2,2,3,3,4,4,4-heptafluorobutyl group, 3,3,4,4,5,5,6,6,6-nonafluorohexyl group, 3,3,4,4,5,5,6,6,7,7,8,8,8-tridodecafluorooctyl group, and the like can be given.

Among these, a perfluoromethyl group, perfluoroethyl group, perfluoropropyl group, perfluorobutyl group, and perfluorooctyl group are particularly preferred due to their capability of moderating the acidity of the hydrogen bonded to the nitrogen atom.

The recurring unit having the group shown by the formula (2) has a hydrogen atom combined with the nitrogen atom which easily dissociates the hydrogen atom by the electron-attracting properties of the $—SO_2—R^3$ group, giving rise to exhibition of acidity in an aqueous solution. Therefore, the resin is insoluble in pure water, but soluble in alkali.

As a preferable example of the recurring unit having the group shown by the formula (2), the recurring unit shown by the following formula (2a) can be given.

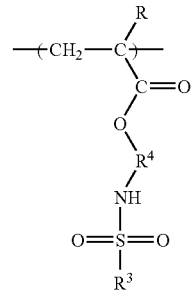

(2a)

wherein R is the same as the R in the formula (3), $R^3$ is the same as the $R^3$ in the formula (2), and $R^4$ is the same as the $R^4$ in the formula (1a). As $R^4$, an ethylene group is particularly preferable.

As examples of the radically-polymerizable monomer which produces the recurring unit having a carboxyl group of the present invention, unsaturated monocarboxylic acids such as (meth)acrylic acid, crotonic acid, cinnamic acid, atropic acid, 3-acetyloxy(meth)acrylic acid, 3-benzoyloxy(meth)acrylic acid, α-methoxyacrylic acid, and 3-cyclohexyl(meth)acrylic acid; unsaturated polycarboxylic acids such as fumaric acid, maleic acid, citraconic acid, mesaconic acid, and itaconic acid; 2-(meth)acrylamide-2-methylpropane carboxylic acid, 2-α-carboxyacrylamide-2-methylpropane carboxylic acid, 2-α-carboxymethylacrylamide-2-methylpropane carboxylic acid, 2-α-methoxycarbonylacrylamide-2-methylpropane carboxylic acid, 2-α-acetyloxyacrylamide-2-methylpropane carboxylic acid, 2-α-phenylacrylamide-2-methylpropane carboxylic acid, 2-α-benzylacrylamide-2-methylpropane carboxylic acid, 2-α-methoxyacrylamide-2-methylpropane carboxylic acid, 2-α-cyclohexylacrylamide-2-methylpropane carboxylic acid, 2-α-cyanoacrylamide-2-methylpropane carboxylic acid, and the like can be given.

Among the above monomers, (meth)acrylic acid and crotonic acid are preferable.

As the monomer having a carboxyl group, monomers having an unsaturated alicyclic group or monomers shown by the formula (4) can be given.

As examples of the monomers having an unsaturated alicyclic group, 2-bicyclo[2.2.1]hept-5-ene carboxylic acid, bicyclo[2.2.1]hept-5-en-2-yl methanecarboxylic acid, 4-tricyclo[5.2.1.0$^{2,6}$]dec-8-ene carboxylic acid, tricyclo [5.2.1.0$^{2,6}$]dec-8-en-4-yl methanecarboxylic acid, and the like can be give. Of these, 2-bicyclo[2.2.1]hept-5-ene carboxylic acid and bicyclo[2.2.1]hept-5-en-2-yl methanecarboxylic acid are preferable.

(4)

wherein R is the same as R in the formula (3), A represents a single bond, a carbonyl group, a carbonyloxy group, or an oxycarbonyl group, and B represents a single bond or a divalent organic group having 1 to 20 carbon atoms. As examples of the divalent organic group having 1 to 20 carbon atoms, saturated linear hydrocarbon groups such as a methylene group, ethylene group, propylene group (1,3-propylene group, 1,2-propylene group), tetramethylene group, pentamethylene group, hexamethylene group, heptamethylene group, octamethylene group, nonamethylene group, decamethylene group, undecamethylene group, dodecamethylene group, tridecamethylene group, tetradecamethylene group, pentadecamethylene group, hexadecamethylene group, heptadecamethylene group, octadecamethylene group, nonadecamethylene group, icosylene group, 1-methyl-1,3-propylene group, 2-methyl-1,3-propylene group, 2-methyl-1,2-propylene group, 1-methyl-1,4-butylene group, 2-methyl-1,4-butylene group, methylidene group, ethylidene group, propylidene group, and 2-propylidene group; arylene groups such as a phenylene group and a tolylene group; monocyclic hydrocarbon groups such as cycloalkylene groups having 3 to 10 carbon atoms such as cyclobutylene groups (e.g. a 1,3-cyclobutylene group), cyclopentylene groups (e.g. a 1,3-cyclopentylene group), cyclohexylene groups (e.g. a 1,4-cyclohexylene group), and cyclooctylene groups (e.g. a 1,5-cyclooctylene group); bridged cyclic hydrocarbon groups such as cyclic hydrocarbon groups with 2 to 4 rings having 4 to 20 carbon atoms such as a norbornylene groups (e.g. 1,4-norbornylene group, 2,5-norbornylene group) and adamantylene groups (e.g. 1,5-adamantylene group, 2,6-adamantylene group); and the like can be given.

The radically polymerizable monomers producing the recurring unit (II) having a sulfo group constituting the copolymer of the present invention is shown by the above formula (3).

In the formula (3), A and B are the same as those defined for the formula (4). The formula (3) can be obtained by replacing the carboxyl group in the formula (4) with a sulfo group.

As preferable examples of the monomers shown by the formula (3), vinylsulfonic acid, allylsulfonic acid, 2-(meth) acrylamide-2-methyl-1-propanesulfonic acid, and 4-vinyl-1-benzenesulfonic acid can be given. Of these sulfonic acid monomers, vinylsulfonic acid and allylsulfonic acid are particularly preferable.

In order to control the refractive index of the top coat, the copolymer of the present invention may contain a recurring unit having a side chain which includes a fluorine atom other than the recurring unit having a side chain which includes an alcoholic hydroxyl group having a fluoroalkyl group at least in the α-position. This recurring unit can be obtained by copolymerizing a monomer containing a fluoroalkyl group.

As examples of the fluoroalkyl group-containing monomer, fluoroalkyl (meth)acrylates having 1 to 20 carbon atoms in the fluoroalkyl group such as difluoromethyl(meth)acrylate, perfluoromethyl(meth)acrylate, 2,2-difluoroethyl (meth)acrylate, 2,2,2-trifluoroethyl(meth)acrylate, perfluoroethyl(meth)acrylate, 1-(perfluoromethyl)ethyl(meth)acrylate, 2-(perfluoromethyl)ethyl(meth)acrylate, 2,2,3,3-tetrafluoropropyl(meth)acrylate, perfluoroethylmethyl(meth) acrylate, di(perfluoromethyl)methyl(meth)acrylate, perfluoropropyl(meth)acrylate, 1-methyl-2,2,3,3-tetrafluoropropyl(meth)acrylate, 1-(perfluoroethyl)ethyl (meth)acrylate, 2-(perfluoroethyl)ethyl(meth)acrylate, 2,2,3,3,4,4-hexafluorobutyl (meth)acrylate, perfluoropropylmethyl (meth)acrylate, perfluorobutyl(meth)acrylate, 1,1-dimethyl-2,2,3,3-tetrafluoropropyl(meth)acrylate, 1,1-dimethyl-2,2,3,3,3-pentafluoropropyl(meth)acrylate, 2-(perfluoropropyl) ethyl (meth)acrylate, 2,2,3,3,4,4,5,5-octafluoropentyl(meth) acrylate, perfluorobutylmethyl (meth)acrylate, perfluoropentyl(meth)acrylate, 1,1-dimethyl-2,2,3,3,4,4-hexafluorobutyl (meth)acrylate, 1,1-dimethyl-2,2,3,3,4,4,4-heptafluorobutyl(meth)acrylate, 2-(perfluorobutyl)ethyl (meth)acrylate, 2,2,3,3,4,4,5,5,6,6-decafluorohexyl (meth) acrylate, perfluoropentylmethyl(meth)acrylate, perfluorohexyl(meth)acrylate, 1,1-dimethyl-2,2,3,3,4,4,5,5-octafluoropentyl(meth)acrylate, 1,1-dimethyl-2,2,3,3,4,4,5,5,5-nonafluoropentyl(meth)acrylate, 2-(perfluoropentyl) ethyl (meth)acrylate, 2,2,3,3,4,4,5,5,6,6,7,7-dodecafluoroheptyl(meth)acrylate, perfluorohexylmethyl (meth)acrylate, perfluoroheptyl(meth)acrylate, 2-(perfluorohexyl)ethyl(meth)acrylate, 2,2,3,3,4,4,5,5,6,6,7,7,8,8-tetradecafluorooctyl (meth)acrylate, perfluoroheptylmethyl(meth)acrylate, perfluorooctyl(meth)acrylate, 2-(perfluoroheptyl)ethyl(meth)acrylate, 2,2,3,3,4,4,5,5,6,6,7,7,8,8,9,9-hexadecafluorononyl(meth)acrylate, perfluorooctylmethyl(meth)acrylate, perfluorononyl(meth) acrylate, 2-(perfluorooctyl)ethyl(meth)acrylate, 2,2,3,3,4,4,5,5,6,6,7,7,8,8,9,9,10,10-octadecafluorodecyl(meth)acrylate, perfluorononylmethyl(meth)acrylate, perfluorodecyl (meth)acrylate, 2,2,3,3,4,4,4-hexafluorobutyl(meth)acrylate, 2,2,3,3,4,4,4-heptafluorobutyl (meth)acrylate, 3,3,4,4,5,5,6,6,6-nonafluorohexyl(meth)acrylate, and 3,3,4,4,5,5,6,6,7,7,8,8,8-tridecafluorooctyl(meth)acrylate; (2,2,2-trifluoroethyl) α-carboxyacrylate, (perfluoroethylmethyl) α-carboxyacrylate, (2,2,2-trifluoroethyl) α-carboxymethyl acrylate, (perfluoroethylmethyl) α-carboxymethyl acrylate, (2,2,2-trifluoroethyl) α-methoxycarbonyl acrylate, (perfluoroethylmethyl) α-methoxycarbonyl acrylate, (2,2,2-trifluoroethyl) α-acetyloxyacrylate, (perfluoroethylmethyl) α-acetyloxy acrylate, (2,2,2-trifluoroethyl) α-phenylacrylate, (perfluoroethylmethyl) α-phenylacrylate, (2,2,2-trifluoroethyl) α-benzylacrylate, (perfluoroethylmethyl) α-benzylacrylate, (2,2,2-trifluoroethyl) α-ethoxyacrylate, (perfluoroethylmethyl) α-ethoxyacrylate, (2,2,2-trifluoroethyl) α-2-methoxyethylacrylate, (perfluoroethylmethyl) α-2-methoxyethylacrylate, (2,2,2-trifluoroethyl) α-cyclohexylacrylate, (perfluoroethylmethyl) α-cyclohexylacrylate, (2,2,2-trifluoroethyl) α-cyanoacrylate, (perfluoroethylmethyl)

α-cyanoacrylate, 3[4[1-trifluoromethyl-2,2-bis[bis(trifluoromethyl)fluoromethyl]ethynyloxy]benzooxy]2-hydroxypropyl(meth)acrylate, (2,2,3,3,3-pentafluoropropyl) 2-phenylacrylate, (2,2,3,3,3-pentafluoropropyl) 2-benzylacrylate, (2,2,3,3,3-pentafluoropropyl) 2-ethoxyacrylate, (2,2,3,3,3-pentafluoropropyl) 2-cyclohexylacrylate, (2,2,3,3,3-pentafluoropropyl) 2-cyanoacrylate, and the like can be given. These monomers containing a fluoroalkyl group may be used either individually or in combination of two or more.

As the monomers containing a fluoroalkyl group in the present invention, fluoroalkyl(meth)acrylates having 1 to 20 carbon atoms in the fluoroalkyl group are preferable. Particularly preferable monomers containing a fluoroalkyl group are perfluoroalkyl(meth)acrylates and fluoroalkyl(meth)acrylates in which the perfluoroalkyl group bonds to the ester oxygen atom via a methylene group, an ethylene group, or a sulfonylamino group.

In order to control the molecular weight, glass transition temperature, adhesion to a silicon substrate, photoresist film, under layer antireflection film, and the like, or the contact angle to a solvent of the copolymer, other radically polymerizable monomers can be copolymerized with the copolymer of the present invention. "Other monomers" here indicate radically polymerizable monomers other than the above-mentioned radically polymerizable monomers. In addition, an acid dissociable group-containing monomers may be copolymerized.

As examples of the other radically polymerizable monomers or acid dissociable group-containing monomers, (meth)acrylic acid alkyl esters, (meth)acrylic acid aryl esters, dicarboxylic acid diesters, nitrile group-containing radically polymerizable monomers, amide bond-containing radically polymerizable monomers, fatty acid vinyl compounds, chlorine-containing radically polymerizable monomers, conjugated diolefins, hydroxyl group-containing (meth)acrylic acid alicyclic alkyl esters, (meth)acrylic acid alicyclic alkyl esters, and the like can be given.

It is particularly preferable that at least one monomer producing other recurring units selected from the group consisting of lactone esters of (meth)acrylic acid and adamantane esters of (meth)acrylic acid be copolymerized with the copolymer of the present invention. As examples of these monomers, (meth)acrylic acid δ-lacton esters, (meth)acrylic acid γ-lacton esters, (meth)acrylic acid adamantane esters, (trifluoro)acrylic acid adamantane esters, (meth)arylic acid norbornene lactone n-methacryl esters, (trifluoro)acrylic acid norbornene lactone n-methacryl esters, and the like can be given.

As specific examples of the other monomers, methyl(meth)acrylate, ethyl (meth)acrylate, n-butyl(meth)acrylate, sec-butyl(meth)acrylate, tert-butyl (meth)acrylate, isopropyl(meth)acrylate, n-hexyl(meth)acrylate, cyclohexyl (meth)acrylate, 2-methylcyclohexyl(meth)acrylate, dicyclopentanyloxyethyl (meth)acrylate, isobornyl(meth)acrylate, dicyclopentanyl(meth)acrylate, methoxydipropylene glycol(meth)acrylate, butoxy-dipropylene glycol(meth)acrylate, methoxydiethylene glycol(meth)acrylate, methoxypropylene glycol(meth)acrylate, 1-methyl-1-cyclohexyl(meth)acrylate, 1-ethyl-1-cyclohexyl(meth)acrylate, 1-propyl-1-cyclohexyl(meth)acrylate, 1-butyl-1-cyclohexyl(meth)acrylate, 1-methyl-1-cyclopentyl(meth)acrylate, 1-ethyl-1-cyclopentyl(meth)acrylate, 1-propyl-1-cyclopentyl(meth)acrylate, and 1-butyl-1-cyclopentyl(meth)acrylate can be given. As examples of hydroxyl group-containing (meth)acrylic acid alkyl esters, 2-hydroxyethyl(meth)acrylate, 3-hydroxypropyl(meth)acrylate, 2-hydroxypropyl (meth)acrylate, 2-hydroxybutyl(meth)acrylate, 2,3-dihydroxypropyl(meth)acrylate, polypropylene glycol(meth)acrylate, 2-hydroxycyclohexyl(meth)acrylate, and 4-hydroxycyclohexyl(meth)acrylate can be given.

Moreover, (meth)acrylic acid alkyl esters such as 1-bicyclo [2.2.1]heptyl-1-methylethyl(meth)acrylate; dicarboxylic acid diesters such as diethyl maleate, diethyl fumarate, and diethyl itaconate; (meth)acrylic acid aryl esters such as phenyl(meth)acrylate and benzyl(meth)acrylate; aromatic vinyls such as styrene, α-methylstyrene, m-methylstyrene, p-methylstyrene, vinyl toluene, and p-methoxy styrene; nitrile group-containing radically polymerizable monomers such as acrylonitrile and methacrylonitrile; amide bond-containing radically polymerizable monomers such as acrylamide, methacryl amide, and trifluoromethane sulfonylaminoethyl (meth)acrylate; fatty acid vinyls such as vinyl acetate; chlorine-containing radically polymerizable monomers such as vinyl chloride and vinylidene chloride; and conjugated diolefins such as 1,3-butadiene, isoprene, and 1,4-dimethyl butadiene can be used.

As specific examples of monomers producing recurring units derived from lactone esters of (meth)acrylic acid, 2-methyl-2-adamantyl(meth)acrylate, 2-ethyl-2-adamantyl(meth)acrylate, 2-propyl-2-adamantyl(meth)acrylate, 2-butyl-2-adamantyl(meth)acrylate, 1-adamantyl-1-methylethyl(meth)acrylate, 3-hydroxy-1-adamantyl(meth)acrylate, 3,5-dihydroxy-1-adamantyl(meth)acrylate; 4-(4-methyl-tetrahydro-2-pyron)yl methacrylate as a (meth)acrylic acid δ-lactone ester, 3-(2-tetrahydrofranon)yl methacrylate and 3-(3-methyl-tetrahydro-2-furan)yl methacrylate as (meth)acrylic acid γ-lactone esters, 3-hydroxy-1-adamantyl-methacrylate and 3-hydroxy-1-adamantyl-1-trifluoromethylacrylate as (trifluoro)acrylic acid adamantane esters, 3-oxa-2-oxatricyclo[4.2.1.0$^{4,8}$]nonan-5-yl-1-trifluoromethyl acrylate and 3-oxa-2-oxatricyclo[4.2.1.0$^{1,8}$]-1-trifluoromethyl-nonan-5-yl acrylate as (trifluoro)acrylic acid norbornene lactone n-methacryl esters, and the like can be given.

Of these, 2-hydroxyethyl(meth)acrylate, 3-hydroxy-1-adamantyl(meth)acrylate, 4-(4-methyl-tetrahydro-2-pyron)yl methacrylate, 3-(2-tetrahydrofuranon)yl methacrylate, 3-(3-methyl-tetrahydro-2-furan)yl methacrylate, 3-hydroxy-1-adamantyl-1-trifluoromethyl acrylate, and 3-oxa-2-oxatricyclo[4.2.1.0$^{1,8}$]-1-trifluoromethyl-nonan-5-yl acrylate are preferable.

These monomers may be used either individually or in combination of two or more.

The copolymer of the present invention contains the above-described recurring unit (I) and recurring unit (II) as essential components. Preferably, (a) a copolymer consisting only of the recurring unit (I) and recurring unit (II), and (b) a copolymer containing, in addition to the recurring unit (I) and recurring unit (II), a recurring unit which has a group containing a fluorine atom other than that shown by the formula (1) on the side chain and/or a recurring unit derived from at least one compound selected from the group consisting of adamantane esters of (meth)acrylic acid as other recurring units, can be given.

The recurring unit having a group shown by the formula (1) (hereinafter "recurring unit IA"), the recurring unit having a group shown by the formula (2) (hereinafter "recurring unit III"), the recurring unit having a carboxyl group (hereinafter "recurring unit IC"), the recurring unit having a sulfo group (hereinafter "recurring unit II"), and other recurring units (hereinafter "recurring unit III") are contained in such a ratio that brings the value of (mol % of IA)/60+(mol % of IB)/40+(mol % of IC)/25 to become 0.7 or more, but preferably 0.8 or more, and the amount of the recurring unit IC is 50 mol % or less, preferably 40 mol % or less, the amount of the recurring unit II is 0.5 to 50 mol %, preferably 1 to 30 mol %, and the amount of the recurring unit III is 0 to 90 mol %, and preferably 0 to 80 mol %.

If the value of (mol % of IA)/60+(mol % of IB)/40+(mol % of IC)/25 is less than 0.7, solubility of the top coat in an alkaline aqueous solution used as a developer is too low for the top coat to be removed. The residue may remain on a resist pattern after development.

If the amount of recurring unit IC is more than 50 mol %, the immersion liquid swells the top coat and an optical image may be adversely affected.

If the amount of recurring unit II is less than 0.5 mol %, the pattern profile may be deteriorated as compared with the case in which the resist is processed by dry exposure; if more than 50 mol %, the immersion liquid swells the top coat and an optical image may be adversely affected.

If the amount of recurring unit III is more than 90 mol %, solubility of the top coat in an alkaline aqueous solution used as a developer is too low for the top coat to be removed. The residue may remain on a resist pattern after development.

The copolymer of the present invention can be prepared by polymerizing a mixture of monomers that can produce each of the above recurring units in an appropriate solvent in the presence of a chain transfer agent, as required, using a radical polymerization initiator.

As examples of the solvent which can be used for the polymerization, alcohols such as methanol, ethanol, 1-propanol, 2-propanol, 1-butanol, 2-butanol, ethylene glycol, diethylene glycol, and propylene glycol; cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, and methyl 3-ethoxypropionate can be given. Of these, cyclic ethers, alkyl ethers of polyhydric alcohol, alkyl ether acetates of polyhydric alcohol, ketones, and esters are preferable.

As the polymerization catalyst in the radical copolymerization, common radical polymerization initiators can be used. As examples, azo compounds such as 2,2'-azobisisobutyronitrile, 2,2'-azobis-(2-methylmethyl propionate), 2,2'-azobis-(2,4-dimethylvaleronitrile), and 2,2'-azobis-(4-methoxy-2-dimethylvaleronitrile); organic peroxide such as benzoyl peroxide, lauroyl peroxide, tert-butyl peroxypivalate, and 1,1'-bis-(tert-butylperoxy)cyclohexane; hydrogen peroxide; and the like can be given. When using a peroxide as the radical polymerization initiator, a reducing agent may be combined to form a redox-type initiator.

The polymerization temperature is usually from 40 to 120° C., and preferably from 50 to 100° C. The reaction time is usually from 1 to 48 hours, and preferably from 1 to 24 hours.

The polystyrene-reduced weight average molecular weight (hereinafter abbreviated as "Mw") of the copolymer obtained in the above polymerization determined by gel permeation chromatography is usually from 2,000 to 100,000, preferably from 2,500 to 50,000, and more preferably from 3,000 to 20,000. If Mw of the copolymer is less than 2,000, solvent resistance such as water resistance and mechanical properties as a top coat is unduly low. If Mw exceeds 100,000, solubility in the later-described solvents is unduly low. The ratio of Mw to the polystyrene-reduced number average molecular weight (hereinafter referred to as "Mn") determined by gel permeation chromatography (GPC) (Mw/Mn) of the copolymer is usually from 1 to 5, and preferably from 1 to 3.

It is preferable that the above copolymers contain almost no impurities such as halogens or metals. The smaller the amount of such impurities, the better are the applicability as a top coat and uniform solubility in an alkaline developer. The copolymer can be purified using, for example, a chemical purification method such as washing with water or liquid-liquid extraction or a combination of the chemical purification method and a physical purification method such as ultrafiltration or centrifugation. The copolymer of the present invention can be used as the resin component of a top coating composition either individually or in combination of two or more.

As the solvent used as a component of the top coating composition of the present invention, a solvent that can dissolve the above-mentioned copolymer without impairing the lithographic performance of the composition by, for example, causing intermixing with a photoresist film when applied to the photoresist film can be used.

As such a solvent, solvents including monohydric alcohols can be given. As examples of such a solvent, methanol, ethanol, 1-propanol, isopropanol, n-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, 4-methyl-3-heptanol, 6-methyl-2-heptanol, 1-octanol, 2-octanol, 3-octanol, 2-propyl-1-pentanol, 2,4,4-trimethyl-1-pentanol, 2,6-dimethyl-4-heptanol, 3-ethyl-2,2-dimethyl-pentanol, 1-nonanol, 2-nonanol, 3,5,5-trimethyl-1-hexanol, 1-decanol, 2-decanol, 4-decanol, 3,7-dimethyl-1-octanol, and 3,7-dimethyl-3-octanol can be given.

Of these monohydric alcohols, monohydric alcohols having 4 to 8 carbon atoms are preferable, with n-butanol and 4-methyl-2-pentanol being particularly preferable.

When applying the top coat to a photoresist film, a solvent other than the above solvents (other solvents) may be mixed in order to adjust applicability. The other solvents have an effect of evenly applying the top coat without eroding the photoresist film.

As examples of the other solvents, polyhydric alcohols such as ethylene glycol and propylene glycol; cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethylmethyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, and methyl 3-ethoxypropionate; and water can be given. Of these, cyclic ethers, alkyl ethers of polyhydric alcohol, alkyl ether acetates of polyhydric alcohol, ketones, esters, and water are preferable.

The amount of the other solvents is 30 wt % or less, and preferably 20 wt % or less of the total amount of the solvents. If more than 30 wt %, the solvent causes problems such as erosion of a photoresist film, intermixing with the top coat, and the like, giving rise to extreme deterioration of resolution performance of the photoresist.

A surfactant can be blended with the top coating composition of the present invention in order to increase applicability, defoamability, leveling properties, and the like.

As the surfactant, commercially available fluorine-containing surfactants such as BM-1000, BM-1100 (manufactured by BM Chemie), Megafac F142D, F172, F173, F183 (manufactured by Dainippon Ink and Chemicals, Inc.), Fluorad FC-135, FC-170C, FC-430, FC-431 (manufactured by Sumitomo 3M, Ltd.), Surflon S-112, S-113, S-131, S-141, S-145 (manufactured by Asahi Glass Co., Ltd.), SH-28PA, SH-190, SH-193, SZ-6032, SF-8428 (manufactured by Toray-Dow Corning Silicone Co., Ltd.), and NBX-15 (manufactured by NEOS Co., Ltd.); commercially available fluorine-free surfactants such as Polyflow No. 75 (manufactured by Kyoeisha Chemical Co., Ltd.); and the like can be given.

The amount of surfactants to be added is preferably 5 parts by weight or less for 100 parts by weight of the alkali-soluble resin.

The top coating composition of the present invention is applied onto a photoresist film for forming patterns by exposure to radiation. The composition is particularly useful as a top coating composition for liquid immersion. An example of using the composition of the present invention as a top coating composition for liquid immersion will now be described.

In the step of forming a photoresist film by applying the photoresist to a substrate, a silicon wafer, an aluminum-coated wafer, or the like may be used as the substrate. In order to bring out the potential of the resist film to the maximum extent, an organic or inorganic antireflection film may be formed on the substrate as disclosed in JP-B-6-12452, for example.

The photoresist used is not particularly limited, and may be appropriately selected according to the purpose of the resist. As an example of the resist, a positive-tone or negative-tone chemically-amplified resist containing an acid generator can be given.

When the top coat of the present invention is used, a positive-tone resist is particularly preferable. In the chemically-amplified positive-tone resist, an acid-dissociable organic group in the polymer dissociates by the action of an acid generated from the acid generator upon exposure to produce a carboxyl group, for example. As a result, the exposed portion of the resist exhibits increased solubility in an alkaline developer and is dissolved in and removed by an alkaline developer, whereby a positive-tone resist pattern is obtained.

The photoresist film is formed by dissolving a resin for forming the photoresist film in an appropriate solvent to a solid content of 0.1 to 20 wt %, for example, filtering the solution through a filter with a pore size of about 30 nm, for example, to obtain a resist solution, applying the resist solution to a substrate using an appropriate coating method such as rotational coating, cast coating, or roll coating, and prebaking (hereinafter abbreviated as "PB") the applied resist solution to volatilize the solvent. In this case, a commercially available resist solution may be used as is.

The step of forming a top coat on the photoresist film using the top coating composition comprises applying the top coating composition of the present invention onto the photoresist film and, usually, baking the composition again. In this step, the top coat is formed in order to protect the photoresist film and to prevent the lens of the projection aligner from being polluted with components eluted from the photoresist film.

In this instance, the closer the thickness of the top coat to an anisoploid of $\lambda/4$ m (wherein $\lambda$ is the wavelength of radiation and m is the refractive index of the top coat), the greater the antireflection effect on the upper side surface of the resist film. Therefore, it is preferable to bring the thickness of the top coat close to this value. In the present invention, either prebaking after the application of the resist solution or baking after the application of the top coating composition solution may be omitted for simplicity of the process.

In the resist pattern-forming step, a resist pattern is formed by applying radiation to the photoresist film and the top coat using water as a medium, for example, through a mask having a specific pattern, followed by developing, wherein exposure to radiation is performed by the immersion lithography, followed by baking at a prescribed temperature and development.

It is possible to adjust the pH of water filled between the photoresist film and the top coat. A particularly preferable liquid medium is pure water.

As the radiation used for the immersion lithography, various types of radiation such as visible light; ultraviolet rays such as g-line and i-line; far ultraviolet rays such as an excimer laser light; X-rays such as synchrotron radiation; and charged particle rays such as electron beams may be selectively used according to the photoresist film used and the combination of the photoresist film and the top coat for immersion lithography. In particular, it is preferable to use light from an ArF excimer laser (wavelength: 193 nm) or a KrF excimer laser (wavelength: 248 nm).

It is preferable to perform post exposure baking (hereinafter abbreviated as "PEB") in order to provide the resist film with improved resolution, pattern profile, developability, and the like. The baking temperature is usually about 30 to 200° C., and preferably 50 to 150° C., although the baking temperature is appropriately adjusted according to the resist used and the like.

The photoresist film is then developed using a developer and washed to form a desired resist pattern. In this case, it is not necessary to add a step of delaminating the top coat. The top coat can be completely removed during development or washing after the development. This is an important feature of the present invention.

As examples of the developer used for forming the resist pattern in the present invention, alkaline aqueous solutions prepared by dissolving alkaline compounds such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, and 1,5-diazabicyclo-[4.3.0]-5-nonane can be given. An appropriate amount of a water-soluble organic solvent such as alcohols including methanol and ethanol or a surfactant can be added to the developer. When developed using these alkaline aqueous solution, the resist film is usually washed with water after the development.

EXAMPLES

Examples 1 to 46 and Comparative Examples 1 to 2

Copolymers were synthesized in the proportions shown in Table 1 according to the following method. Mw and Mn of the copolymers were measured by gel permeation chromatography (GPC) using GPC columns ("G2000H$_{XL}$"×2, "G3000H$_{XL}$"×1, "G4000H$_{XL}$"×1, manufactured by Tosoh Corp.) in a high performance GPC apparatus ("HLC-8120" manufactured by Tosoh Corp.) under the following conditions. Flow rate: 1.0 ml/minute, eluate: tetrahydrofuran, column temperature: 40° C., standard reference material: monodispersed polystyrene Proportions of the recurring units in the copolymers were measured by $^{13}$C NMR.

The monomers used for the synthesis of the copolymers are shown in the following formulas (M-1) to (M-15) and (S-1) to (S-4).

(M-1)
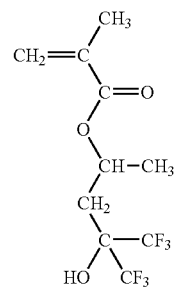

(M-2)
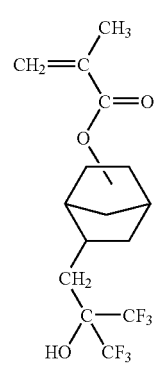

-continued (M-3)
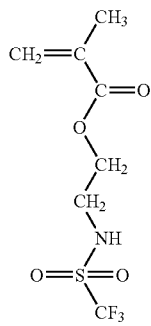

(M-4)
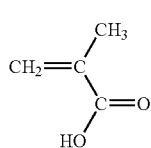

(M-5)
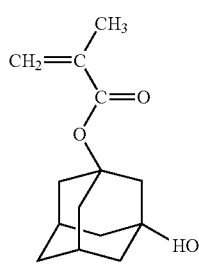

(M-6)
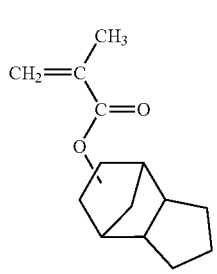

(M-7)
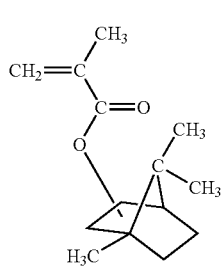

(M-8)
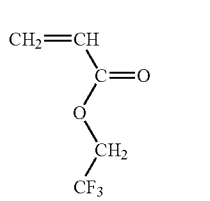

-continued

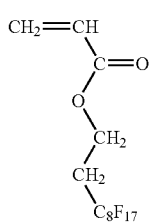 (M-9)

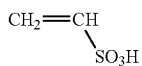

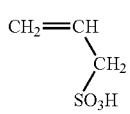

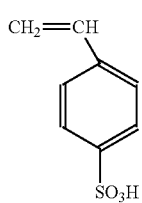

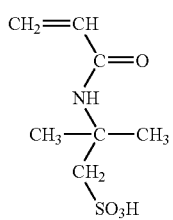 (M-10)

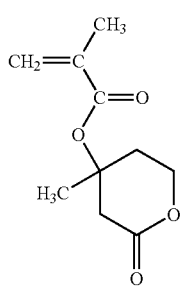 (M-11)

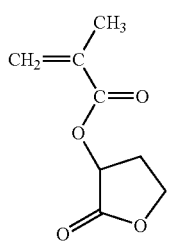 (M-12)

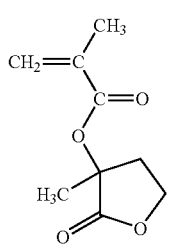

-continued

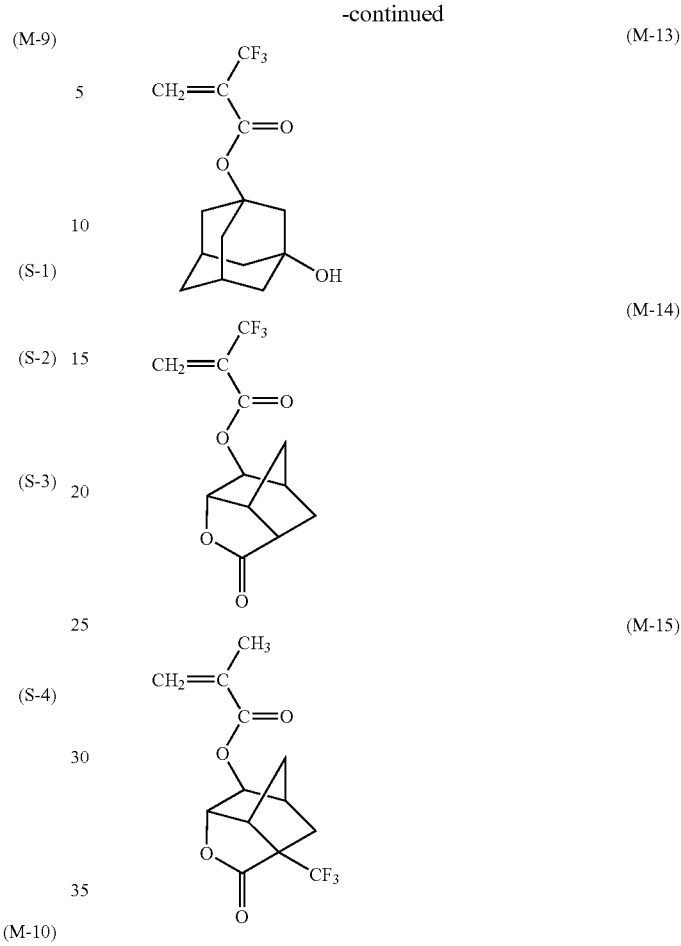

(M-13)

(S-1)

(M-14)

(S-2)

(S-3)

(M-15)

(S-4)

Among the above monomers, the monomers of the formulas (M-1) and (M-2) produce the recurring unit IA, the monomer of the formula (M-3) produces the recurring unit IB, the monomer of the formula (M-4) produces the recurring unit IC, the monomers of the formulas (S-1) to (S-4) produce the recurring unit II, and the monomers of the formulas (M-5) to (M-15) produce the recurring unit III.

The monomer solutions were prepared by dissolving monomers of the weight corresponding to mol % shown in Table 1 and 2,2'-azobis-(2-methylmethyl propionate) as an initiator in 200 g of isopropanol. The total amount of the monomers prepared was adjusted to 100 g.

A 1,500 ml three-necked flask equipped with a thermometer and a dropping funnel was charged with 100 g of isopropanol and purged with nitrogen for 30 minutes. The content of the flask was heated to 80° C. while stirring using a magnetic stirrer. The monomer solution prepared as above was added to the dropping funnel and dropped to the flask over 3 hours. After the addition, the mixture was reacted for three hours, then allowed to cool to 30° C. or less, thereby obtaining a copolymer solution.

In the above experiments, a mixture of 90 g of isopropanol and 10 g of water was used instead of 100 g of isopropanol as the solvent for synthesizing the copolymer (A-4) of Example 4 and the copolymer (A-16) of Example 16.

TABLE 1

| | Copolymer | Amount of charged monomers (mol %) | | | | | | | | | |
|---|---|---|---|---|---|---|---|---|---|---|---|
| | | M-1 | M-2 | M-3 | M-4 | M-5 | M-6 | M-7 | M-8 | M-9 | M-10 |
| Example | | | | | | | | | | | |
| 1 | A-1 | 95 | — | — | — | — | — | — | — | — | — |
| 2 | A-2 | 95 | — | — | — | — | — | — | — | — | — |
| 3 | A-3 | 95 | — | — | — | — | — | — | — | — | — |
| 4 | A-4 | 90 | — | — | — | — | — | — | — | — | — |
| 5 | A-5 | 60 | — | — | — | 20 | — | — | — | — | — |
| 6 | A-6 | 75 | — | — | — | — | 15 | — | — | — | — |
| 7 | A-7 | 80 | — | — | — | — | — | 15 | — | — | — |
| 8 | A-8 | — | — | 95 | — | — | — | — | — | — | — |
| 9 | A-9 | — | — | 50 | — | 47 | — | — | — | — | — |
| 10 | A-10 | 70 | 28 | — | — | — | — | — | — | — | — |
| 11 | A-11 | 75 | — | — | — | — | — | — | — | 15 | — |
| 12 | A-12 | 75 | — | — | — | — | — | — | 20 | — | — |
| 13 | A-13 | — | 15 | — | 25 | 35 | — | — | 20 | — | — |
| 14 | A-14 | — | — | — | 25 | 40 | — | — | — | 30 | — |
| 15 | A-15 | — | — | — | 30 | 25 | — | — | 30 | — | — |
| 16 | A-16 | — | 30 | — | 25 | 30 | — | — | — | 10 | — |
| 17 | A-17 | — | — | — | 25 | 50 | — | — | — | 20 | — |
| 18 | A-18 | — | — | — | 25 | 60 | — | — | — | 10 | — |
| 19 | A-19 | — | — | — | 25 | 45 | — | — | 10 | — | — |
| 20 | A-20 | — | — | — | 25 | 50 | — | — | 20 | — | — |
| 21 | A-21 | — | — | — | 25 | 30 | — | — | 30 | — | — |
| 22 | A-22 | — | — | — | 15 | 55 | 10 | — | — | — | — |
| 23 | A-23 | — | — | — | 20 | 50 | — | — | — | 20 | — |
| 24 | A-24 | 55 | — | — | — | 40 | — | — | — | — | — |
| 25 | A-25 | — | — | — | 25 | 60 | — | — | 10 | — | — |
| 26 | A-26 | 90 | — | — | — | — | — | — | — | — | — |
| 27 | A-27 | 85 | — | — | — | — | — | — | — | — | — |
| 28 | A-28 | — | — | 85 | — | — | — | — | — | — | — |
| 29 | A-29 | — | — | 85 | — | — | — | — | — | — | — |
| 30 | A-30 | 70 | — | — | — | — | — | — | — | 15 | — |
| 31 | A-31 | 70 | 15 | — | — | — | — | — | — | — | — |
| 32 | A-32 | 70 | — | — | — | — | — | — | — | — | 15 |
| 33 | A-33 | 70 | — | — | — | — | 15 | — | — | — | — |
| 34 | A-34 | 70 | — | — | — | 15 | — | — | — | — | — |
| 35 | A-35 | 70 | — | — | — | — | — | — | — | — | — |
| 36 | A-36 | 70 | — | — | — | — | — | — | — | — | — |
| 37 | A-37 | 70 | — | — | — | — | — | — | — | — | — |
| 38 | A-38 | — | — | 80 | — | 15 | — | — | — | — | — |
| 39 | A-39 | — | — | 70 | — | — | — | — | — | — | 15 |
| 40 | A-40 | — | — | 70 | — | — | — | — | — | — | — |
| 41 | A-41 | — | — | 70 | — | — | — | — | — | — | — |
| 42 | A-42 | 70 | — | — | — | — | — | — | — | — | — |
| 43 | A-43 | 75 | — | 10 | — | — | — | — | — | — | — |
| 44 | A-44 | 60 | — | 25 | — | — | — | — | — | — | — |
| 45 | A-45 | 25 | — | 60 | — | — | — | — | — | — | — |
| 46 | A-46 | — | — | 65 | — | — | — | — | — | — | — |
| Comparative Example | | | | | | | | | | | |
| 1 | C-1 | — | 30 | — | 30 | 40 | — | — | — | — | — |
| 2 | C-2 | — | 10 | — | 30 | 60 | — | — | — | — | — |

| | Amount of charged monomers (mol %) | | | | | | | | | Amount of initiator |
|---|---|---|---|---|---|---|---|---|---|---|
| | M-11 | M-12 | M-13 | M-14 | M-15 | S-1 | S-2 | S-3 | S-4 | (g) |
| Example | | | | | | | | | | |
| 1 | — | — | — | — | — | 5 | — | — | — | 6.5 |
| 2 | — | — | — | — | — | — | 5 | — | — | 6.4 |
| 3 | — | — | — | — | — | — | — | 5 | — | 6.4 |
| 4 | — | — | — | — | — | — | — | — | 10 | 6.5 |
| 5 | — | — | — | — | 20 | — | — | — | — | 7.5 |
| 6 | — | — | — | — | — | — | 10 | — | — | 6.9 |
| 7 | — | — | — | — | — | 5 | — | — | — | 6.8 |
| 8 | — | — | — | — | — | — | 5 | — | — | 7.2 |
| 9 | — | — | — | — | — | — | 3 | — | — | 7.5 |
| 10 | — | — | — | — | — | — | — | 2 | — | 5.9 |
| 11 | — | — | — | — | — | 10 | — | — | — | 6.0 |
| 12 | — | — | — | — | — | — | 5 | — | — | 7.1 |
| 13 | — | — | — | — | — | 5 | — | — | — | 9.5 |
| 14 | — | — | — | — | — | 5 | — | — | — | 6.6 |

TABLE 1-continued

| | | | | | | | | | | |
|---|---|---|---|---|---|---|---|---|---|---|
| 15 | — | — | — | — | — | — | — | 15 | — | 11.6 |
| 16 | — | — | — | — | — | — | — | — | 5 | 7.0 |
| 17 | — | — | — | — | — | — | 5 | — | — | 7.4 |
| 18 | — | — | — | — | — | — | 5 | — | — | 8.3 |
| 19 | — | — | — | — | — | — | 20 | — | — | 11.0 |
| 20 | — | — | — | — | — | 5 | — | — | — | 10.5 |
| 21 | — | — | — | — | — | — | 15 | — | — | 11.7 |
| 22 | — | — | — | — | — | — | — | 20 | — | 9.1 |
| 23 | — | — | — | — | — | — | 10 | — | — | 7.3 |
| 24 | — | — | — | — | — | — | 5 | — | — | 7.0 |
| 25 | — | — | — | — | — | — | 5 | — | — | 10.0 |
| 26 | — | — | — | — | — | 10 | — | — | — | 6.7 |
| 27 | — | — | — | — | — | 15 | — | — | — | 6.9 |
| 28 | — | — | — | — | — | — | 15 | — | — | 7.7 |
| 29 | — | — | — | — | — | 15 | — | — | — | 7.7 |
| 30 | — | — | — | — | — | 15 | — | — | — | 6.1 |
| 31 | — | — | — | — | — | 15 | — | — | — | 6.7 |
| 32 | — | — | — | — | — | 15 | — | — | — | 7.3 |
| 33 | — | — | — | — | — | 15 | — | — | — | 6.3 |
| 34 | — | — | — | — | — | 15 | — | — | — | 7.1 |
| 35 | — | — | 15 | — | — | 15 | — | — | — | 5.2 |
| 36 | — | — | — | 15 | — | 15 | — | — | — | 5.2 |
| 37 | — | — | — | — | 15 | 15 | — | — | — | 5.2 |
| 38 | — | — | — | — | — | 5 | — | — | — | 7.4 |
| 39 | — | — | — | — | — | 15 | — | — | — | 8.0 |
| 40 | 15 | — | — | — | — | 15 | — | — | — | 8.2 |
| 41 | — | 15 | — | — | — | 15 | — | — | — | 8.1 |
| 42 | — | 15 | — | — | — | 15 | — | — | — | 7.4 |
| 43 | — | — | — | — | — | 15 | — | — | — | 7.0 |
| 44 | — | — | — | — | — | 15 | — | — | — | 7.1 |
| 45 | — | — | — | — | — | 15 | — | — | — | 7.5 |
| 46 | 20 | — | — | — | — | 15 | — | — | — | 8.4 |
| Comparative Example | | | | | | | | | | |
| 1 | — | — | — | — | — | — | — | — | — | 8.1 |
| 2 | — | — | — | — | — | — | — | — | — | 9.0 | the copolymers of Example 1 to Example 12 (A-1 to A-12) and the copolymers of Example 14 to Example 46 (A-14 to A-46), and the post-treatment method (2) was applied to the copolymers of Example 13 to Example 22 (A-13 to A-22) and the copolymers (C-1) and (C-2) of Comparative Examples. The post-treatment methods (1) and (2) are as follows.

Post-Treatment Method (1)

The above copolymer solutions were condensed to 200 g and transferred to a separating funnel together with 200 g of methanol and 1,600 g of n-heptane. The mixture was sufficiently stirred to separate the lower layer. The separated lower layer was mixed with 200 g of methanol and 1,600 g of n-heptane and the mixture was transferred to a separating funnel to separate the lower layer. The solvent in the resulting lower layer was replaced with 4-methyl-2-pentanol. The solid component concentration of the sample of which the solvent was replaced was calculated from the weight of the residue when 0.3 g of resin solutions placed on an aluminum pan was heated on a hot plate at 140° C. for two hours. The calculated value was used for preparation of top coat solutions and calculation of yields in the subsequent experiments. Mw, Mw/Mn (molecular weight dispersion), yield (wt %), and ratios of recurring units in the copolymers were determined. The results are shown in Table 2.

Post-Treatment Method (2)

The above copolymer solutions were dropped to 3,000 g of n-heptane over 20 minutes with stirring, followed by continued stirring for one hour. The resulting slurry solution was filtered through a Buchner funnel to obtain a white powder, to which 600 g of n-heptane was added and the mixture was stirred to prepare a slurry solution. The slurry solution was again filtered through a Buchner funnel. The resulting powder was dried in a vacuum drier at 50° C. for 24 hours. Mw, Mw/Mn (molecular weight dispersion), yield (wt %), and ratios of recurring units in the copolymers were determined. The results are shown in Table 2.

TABLE 2

| | Copolymer | Mol % of recurring units based on monomers in copolymer | | | | | | | | | | |
| | | M-1 | M-2 | M-3 | M-4 | M-5 | M-6 | M-7 | M-8 | M-9 | M-10 | M-11 |
| Example | | | | | | | | | | | | |
| 1 | A-1 | 95 | — | — | — | — | — | — | — | — | — | — |
| 2 | A-2 | 96 | — | — | — | — | — | — | — | — | — | — |
| 3 | A-3 | 95 | — | — | — | — | — | — | — | — | — | — |
| 4 | A-4 | 94 | — | — | — | — | — | — | — | — | — | — |
| 5 | A-5 | 60 | — | — | — | 22 | — | — | — | — | — | — |

TABLE 2-continued

| # | Code | C1 | C2 | C3 | C4 | C5 | C6 | C7 | C8 | C9 | C10 |
|---|------|----|----|----|----|----|----|----|----|----|----|
| 6 | A-6 | 80 | — | — | — | — | 13 | — | — | — | — |
| 7 | A-7 | 82 | — | — | — | — | — | 13 | — | — | — |
| 8 | A-8 | — | — | 96 | — | — | — | — | — | — | — |
| 9 | A-9 | — | — | 51 | — | 48 | — | — | — | — | — |
| 10 | A-10 | 71 | 27 | — | — | — | — | — | — | — | — |
| 11 | A-11 | 76 | — | — | — | — | — | — | — | 16 | — |
| 12 | A-12 | 79 | — | — | — | — | — | — | 18 | — | — |
| 13 | A-13 | — | 14 | — | 28 | 34 | — | — | 19 | — | — |
| 14 | A-14 | — | — | — | 29 | 40 | — | — | — | 27 | — |
| 15 | A-15 | — | — | — | 34 | 26 | — | — | 28 | — | — |
| 16 | A-16 | — | 28 | — | 27 | 31 | — | — | — | 11 | — |
| 17 | A-17 | — | — | — | 29 | 49 | — | — | — | 18 | — |
| 18 | A-18 | — | — | — | 28 | 59 | — | — | — | 9 | — |
| 19 | A-19 | — | — | — | 30 | 46 | — | — | 9 | — | — |
| 20 | A-20 | — | — | — | 28 | 48 | — | — | 19 | — | — |
| 21 | A-21 | — | — | — | 29 | 30 | — | — | 29 | — | — |
| 22 | A-22 | — | — | — | 18 | 57 | 8 | — | — | — | — |
| 23 | A-23 | — | — | — | 22 | 49 | — | — | — | 23 | — |
| 24 | A-24 | 58 | — | — | — | 39 | — | — | — | — | — |
| 25 | A-25 | — | — | — | 29 | 61 | — | — | 7 | — | — |
| 26 | A-26 | 92 | — | — | — | — | — | — | — | — | — |
| 27 | A-27 | 89 | — | — | — | — | — | — | — | — | — |
| 28 | A-28 | — | — | 89 | — | — | — | — | — | — | — |
| 29 | A-29 | — | — | 88 | — | — | — | — | — | — | — |
| 30 | A-30 | 73 | — | — | — | — | — | — | — | 17 | — |
| 31 | A-31 | 72 | 17 | — | — | — | — | — | — | — | — |
| 32 | A-32 | 73 | — | — | — | — | — | — | — | — | 17 |
| 33 | A-33 | 73 | — | — | — | — | 16 | — | — | — | — |
| 34 | A-34 | 74 | — | — | — | 16 | — | — | — | — | — |
| 35 | A-35 | 74 | — | — | — | — | — | — | — | — | — |
| 36 | A-36 | 73 | — | — | — | — | — | — | — | — | — |
| 37 | A-37 | 74 | — | — | — | — | — | — | — | — | — |
| 38 | A-38 | — | — | 83 | — | 14 | — | — | — | — | — |
| 39 | A-39 | — | — | 72 | — | — | — | — | — | 18 | — |
| 40 | A-40 | — | — | 72 | — | — | — | — | — | — | 15 |
| 41 | A-41 | — | — | 72 | — | — | — | — | — | — | — |
| 42 | A-42 | 72 | — | — | — | — | — | — | — | — | — |
| 43 | A-43 | 77 | — | 12 | — | — | — | — | — | — | — |
| 44 | A-44 | 61 | — | 24 | — | — | — | — | — | — | — |
| 45 | A-45 | 24 | — | 63 | — | — | — | — | — | — | — |
| 46 | A-46 | — | — | 68 | — | — | — | — | — | — | 21 |

Comparative Example

| # | Code | C1 | C2 | C3 | C4 | C5 | C6 | C7 | C8 | C9 | C10 |
|---|------|----|----|----|----|----|----|----|----|----|----|
| 1 | C-1 | — | 30 | — | 30 | 40 | — | — | — | — | — |
| 2 | C-2 | — | 10 | — | 30 | 60 | — | — | — | — | — |

| | Mol % of recurring units based on monomers in copolymer | | | | | | | | | | Yield |
|---|---|---|---|---|---|---|---|---|---|---|---|
| | M-12 | M-13 | M-14 | M-15 | S-1 | S-2 | S-3 | S-4 | Mw | Dispersion | (%) |

Example

| # | M-12 | M-13 | M-14 | M-15 | S-1 | S-2 | S-3 | S-4 | Mw | Dispersion | Yield (%) |
|---|------|------|------|------|-----|-----|-----|-----|------|------|-----|
| 1 | — | — | — | — | 5 | — | — | — | 5700 | 1.7 | 72 |
| 2 | — | — | — | — | — | 4 | — | — | 6120 | 1.7 | 74 |
| 3 | — | — | — | — | — | — | 5 | — | 6310 | 1.8 | 70 |
| 4 | — | — | — | — | — | — | — | 6 | 6180 | 1.7 | 68 |
| 5 | — | — | — | — | 18 | — | — | — | 6020 | 1.8 | 75 |
| 6 | — | — | — | — | — | 7 | — | — | 5910 | 1.7 | 72 |
| 7 | — | — | — | — | 5 | — | — | — | 6460 | 1.7 | 71 |
| 8 | — | — | — | — | — | 4 | — | — | 6360 | 1.8 | 73 |
| 9 | — | — | — | — | 1 | — | — | — | 6180 | 1.8 | 73 |
| 10 | — | — | — | — | — | — | 2 | — | 6420 | 1.8 | 71 |
| 11 | — | — | — | — | 8 | — | — | — | 5990 | 1.7 | 67 |
| 12 | — | — | — | — | — | 3 | — | — | 6170 | 1.7 | 74 |
| 13 | — | — | — | — | 5 | — | — | — | 6830 | 1.7 | 85 |
| 14 | — | — | — | — | — | 4 | — | — | 6960 | 1.8 | 83 |
| 15 | — | — | — | — | — | — | 12 | — | 6420 | 1.8 | 80 |
| 16 | — | — | — | — | — | — | — | 3 | 7020 | 1.7 | 84 |
| 17 | — | — | — | — | — | 4 | — | — | 6730 | 1.7 | 78 |
| 18 | — | — | — | — | — | 4 | — | — | 6930 | 1.7 | 73 |
| 19 | — | — | — | — | — | 15 | — | — | 6740 | 1.8 | 81 |
| 20 | — | — | — | — | 5 | — | — | — | 6480 | 1.8 | 77 |
| 21 | — | — | — | — | — | 12 | — | — | 6620 | 1.7 | 80 |
| 22 | — | — | — | — | — | — | 17 | — | 6850 | 1.7 | 73 |
| 23 | — | — | — | — | — | 6 | — | — | 6850 | 1.7 | 72 |
| 24 | — | — | — | — | — | 3 | — | — | 6490 | 1.8 | 80 |
| 25 | — | — | — | — | — | 3 | — | — | 5990 | 1.8 | 78 |
| 26 | — | — | — | — | 8 | — | — | — | 6030 | 1.6 | 70 |

TABLE 2-continued

| | | | | | | | | | | | |
|---|---|---|---|---|---|---|---|---|---|---|---|
| 27 | — | — | — | — | 11 | — | — | — | 5700 | 1.7 | 73 |
| 28 | — | — | — | — | — | 11 | — | — | 6430 | 1.7 | 72 |
| 29 | — | — | — | — | 12 | — | — | — | 5390 | 1.7 | 73 |
| 30 | — | — | — | — | 10 | — | — | — | 5630 | 1.7 | 75 |
| 31 | — | — | — | — | 11 | — | — | — | 5490 | 1.8 | 75 |
| 32 | — | — | — | — | 10 | — | — | — | 6010 | 1.7 | 73 |
| 33 | — | — | — | — | 11 | — | — | — | 5730 | 1.7 | 71 |
| 34 | — | — | — | — | 10 | — | — | — | 5500 | 1.7 | 71 |
| 35 | — | 16 | — | — | 10 | — | — | — | 5640 | 1.7 | 73 |
| 36 | — | — | 16 | — | 11 | — | — | — | 5530 | 1.8 | 73 |
| 37 | — | — | — | 15 | 11 | — | — | — | 5630 | 1.7 | 74 |
| 38 | — | — | — | — | 3 | — | — | — | 6130 | 1.7 | 79 |
| 39 | — | — | — | — | 10 | — | — | — | 5420 | 1.8 | 71 |
| 40 | — | — | — | — | 13 | — | — | — | 5310 | 1.7 | 69 |
| 41 | 16 | — | — | — | 12 | — | — | — | 5640 | 1.8 | 72 |
| 42 | 16 | — | — | — | 12 | — | — | — | 5490 | 1.7 | 73 |
| 43 | — | — | — | — | 11 | — | — | — | 5280 | 1.7 | 70 |
| 44 | — | — | — | — | 15 | — | — | — | 5430 | 1.7 | 68 |
| 45 | — | — | — | — | 13 | — | — | — | 5620 | 1.8 | 72 |
| 46 | — | — | — | — | 11 | — | — | — | 5700 | 1.7 | 70 |
| Comparative Example | | | | | | | | | | | |
| 1 | — | — | — | — | — | — | — | — | 8200 | 2 | 80 |
| 2 | — | — | — | — | — | — | — | — | 7800 | 2.3 | 95 |

Examples 47 to 92 and Comparative Examples 3 to 5

Top coating compositions for liquid immersion was produced using the copolymers obtained in the above examples. Solvents shown in Table 3 were added to copolymer solids shown in Table 2 to make a ratio of the solid to the solvent of 1 g: 99 g. After stirring for two hours, the mixtures were filtered through a filter with a pore size of 200 nm to obtain solutions. In Table 3, B indicates n-butanol and 4M2P indicates 4-methyl-2-pentanol, respectively, and the solvent ratio for mixed solvents is shown by weight.

The top coating compositions obtained were evaluated by the following methods. The results are shown in Table 3. Comparative Example 5 is shown as a reference example, in which patterning was evaluated without using a top coat.

(1) Evaluation Method of Solubility (Solubility)

For evaluating compositions in Examples 47 to 92 and Comparative Examples 3 to 5, 1 g of the copolymers used as resins for the top coats were added to 99 g of the solvents shown in Table 3 and the mixtures were stirred at 100 rpm using a three-one motor for three hours. The copolymers obtained in Examples 1 to 12 were used after drying the copolymer solutions at 100° C. for 24 hours to a solid state. In the evaluation, a copolymer producing a homogeneous mixture with a solvent was evaluated to have good solubility and indicated as "Good", and a copolymer producing undissolved matter or exhibiting turbidity was evaluated to have poor solubility and indicated as "Bad".

(2) Evaluation Method of Top Coat Removability (Removability)

The compositions were spin-coated on eight-inch silicon wafers using "CLEAN TRACK ACT8" (manufactured by Tokyo Electron, Ltd.) and baked at 90° C. for 60 seconds to form coatings with a thickness of 32 nm. The thickness was measured by using "Ramda Ace VM-90" (Dainippon Screen Mfg. Co., Ltd.). After paddle development (developer: 2.38% aqueous solution of TMAH) for 60 seconds using "CLEAN TRACK ACT8" for 60 seconds, the wafers were dried by spinning to observe the surfaces. If development was complete with no residues being observed, the removability was judged to be "Good". If a residue was observed, the removability was judged to be "Bad".

(3) Evaluation Method of Intermixing (Intermixing)

"ArF AR1221J" manufactured by JSR Corp. was spin-coated on an eight-inch silicon wafer which was previously subjected to an HMDS treatment (100° C., 60 seconds). The coating was prebaked (PB) on a hot plate at 90° C. for 60 seconds to obtain a film with a prescribed thickness (300 nm). The top coat composition for liquid immersion was spin-coated on the above film and prebaked (PB) at 90° C. for 60 seconds to form a coating with a thickness of 32 nm. Ultrapure water was injected onto the wafer from rinse nozzles of "CLEAN TRACK ACT8" for 60 seconds, followed by spin-drying at 4,000 rpm for 15 seconds and paddle development using LD nozzles for 60 seconds using the "CLEAN TRACK ACT8", thereby removing the top coat. A 2.38% TMAH aqueous solution was used as a developer in the development step. Although the coating for liquid immersion was removed by the development step, the resist coating film which was not exposed remained as is. The coating thickness was measured by using "Ramda Ace VM-90" (Dainippon Screen Mfg. Co., Ltd.) before and after this step. If the resist film thickness change was not more than 0.5%, intermixing between the resist coating film and the top coat for liquid immersion was judged not to occur and rated as "Good", and if the change was greater than 0.5%, the evaluation result was rated as "Bad".

(4) Stability Evaluation of Top Coat Composition for Liquid Immersion in Water (Water Resistance)

A coating (thicknesses: 30 nm) of the top coat composition for liquid immersion was formed by spin-coating and prebaked (PB) at 90° C. for 60 seconds on an eight-inch silicon wafer to measure the thickness by using "Ramda Ace VM-90". Ultrapure water was injected onto the wafer from rinse nozzles of "CLEAN TRACK ACT8", followed by spin-drying at 4,000 rpm for 15 seconds. The thickness of this substrate was measured again. When the amount of decrease in the thickness was 0.3% or less of the initial thickness, the coating was judged to be stable and evaluated to be "Good", and to be "Bad" if more than 3%.

(5) Evaluation of Patterning 1

The evaluation method of patterning of a resist using the above top coat is described below.

After forming a coating with a thickness of 77 nm (after PB at 205° C. for 60 seconds) using an underlayer reflection preventing film "ARC29A" (manufactured by Brewer Science, Inc.) on an eight-inch silicon wafer by spin coating, patterns were produced using "ArF AR1244J" (manufactured by JSR, Corp.). The "AR1244J" film with a thickness of 205 nm was prepared by spin coating and PB (130° C., 90 seconds), followed by forming the top coat by spin coating and PB (90° C., 60 seconds) to obtain a coating with a thickness of 32 nm. Next, after exposure under the conditions of NA of 0.78, sigma of 0.85, and ⅔ Ann using an ArF projection aligner "S306C" (Nikon Corp.), ultrapure water was injected onto the wafer from rinse nozzles of "CLEAN TRACK ACT 8" for 60 seconds, followed by spin-drying at 4,000 rpm for 15 seconds. The substrate was then subjected to PEB (130° C., 90 seconds) on the hot plate of "CLEAN TRACK ACT 8", developed (60 seconds) using LD nozzles of the "CLEAN TRACK ACT 8", rinsed with ultrapure water, and spin-dried by swinging at 4,000 rpm for 15 seconds.

90 nm line-and-space patterns were observed using a scanning electron microscope ("S-9360" manufactured by Hitachi High-Tech Fielding Corporation) to determine a exposure dose at which the line width was 90 nm (optimum exposure dose). The minimum line-and-space dimension resolved by the optimum exposure dose was taken as the resolution. The results are shown in Table 3. A cross-sectional configuration of a line-and-space pattern with a line width of 90 nm was observed. FIG. 1 shows the cross-sectional configuration of the line-and-space pattern. A line width Lb in the middle of a pattern 2 on a coating formed on a substrate 1 and a line width La on the upper part of the coating were measured. The configurations were judged as "rectangular" when 0.9<=(La−Lb)/Lb<=1.1 was satisfied; as "tapered" when (La−Lb)/Lb<0.9 was satisfied; and as "head-projected" when (La−Lb)/Lb>1.1 was satisfied.

In Example 5, "AR1221J" film with a thickness of 205 nm prepared by spin coating and PB (130° C., 90 seconds) was subjected to the evaluation of patterning without forming a top coat.

(6) Evaluation of Patterning 2

The evaluation method of patterning of a resist using the above top coat is described below.

After forming a coating with a thickness of 77 nm (after PB at 205° C. for 60 seconds) using an underlayer reflection preventing film "ARC29A" (manufactured by Brewer Science, Inc.) on an eight-inch silicon wafer by spin coating, patterns were produced using "ArF AR1682J" (manufactured by JSR, Corp.). The "AR1682F" film with a thickness of 205 nm was prepared by spin coating and PB (110° C., 90 seconds), followed by forming the top coat by spin coating and PB (90° C., 60 seconds) to obtain a coating with a thickness of 32 nm. Next, after exposure under the conditions of NA of 0.78, sigma of 0.85, and ⅔ Ann using an ArF projection aligner "S306C" (Nikon Corp.), ultrapure water was injected onto the wafer from rinse nozzles of "CLEAN TRACK ACT 8" for 60 seconds, followed by spin-drying at 4,000 rpm for 15 seconds. The substrate was then subjected to PEB (110° C., 90 seconds) on the hot plate of "CLEAN TRACK ACT 8", developed (60 seconds) by paddle development using LD nozzles of the "CLEAN TRACK ACT 8", rinsed with ultrapure water, and spin-dried by swinging at 4,000 rpm for 15 seconds.

90 nm line-and-space patterns were observed using a scanning electron microscope ("S-9360" manufactured by Hitachi High-Tech Fielding Corporation) to determine a exposure dose at which the line width was 90 nm (optimum exposure dose). The minimum line-and-space dimension resolved by the optimum exposure dose was taken as the resolution. The results are shown in Table 3. The cross-sectional configuration of a 90 nm line-and-space pattern as shown in FIG. 1 was observed to measure the line width Lb in the middle and the line width La on the upper part of the coating. The configurations were judged as "rectangular" when 0.9<=(La−Lb)/Lb<=1.1 was satisfied; as "tapered" when (La−Lb)/Lb<0.9 was satisfied; and as "head-projected" when (La−Lb)/Lb>1.1 was satisfied.

In Example 5, "AR1682J" film with a thickness of 205 nm prepared by spin coating and PB (110° C., 90 seconds) was subjected to the evaluation of patterning without forming a top coat.

TABLE 3

| | Copolymer | Solvent | Solubility | Removability | Intermixing | Water Resistance | Evaluation of patterning 1 | | Evaluation of patterning 2 | |
|---|---|---|---|---|---|---|---|---|---|---|
| | | | | | | | Resolution | Configuration | Resolution | Configuration |
| Example | | | | | | | | | | |
| 47 | A-1 | 4M2P = 100 | Good | Good | Good | Good | 85 nm | rectangular | 80 nm | rectangular |
| 48 | A-2 | 4M2P = 100 | Good | Good | Good | Good | 85 nm | rectangular | 80 nm | rectangular |
| 49 | A-3 | 4M2P = 100 | Good | Good | Good | Good | 85 nm | rectangular | 80 nm | rectangular |
| 50 | A-4 | 4M2P = 100 | Good | Good | Good | Good | 85 nm | rectangular | 80 nm | rectangular |
| 51 | A-5 | 4M2P = 100 | Good | Good | Good | Good | 85 nm | rectangular | 80 nm | rectangular |
| 52 | A-6 | 4M2P/B = 50/50 | Good | Good | Good | Good | 85 nm | rectangular | 80 nm | rectangular |
| 53 | A-7 | 4M2P/B = 50/50 | Good | Good | Good | Good | 85 nm | rectangular | 80 nm | rectangular |
| 54 | A-8 | 4M2P = 100 | Good | Good | Good | Good | 85 nm | rectangular | 80 nm | rectangular |
| 55 | A-9 | 4M2P = 100 | Good | Good | Good | Good | 85 nm | rectangular | 80 nm | rectangular |
| 56 | A-10 | 4M2P = 100 | Good | Good | Good | Good | 85 nm | rectangular | 80 nm | rectangular |
| 57 | A-11 | 4M2P = 100 | Good | Good | Good | Good | 85 nm | rectangular | 80 nm | rectangular |
| 58 | A-12 | 4M2P = 100 | Good | Good | Good | Good | 85 nm | rectangular | 80 nm | rectangular |
| 59 | A-13 | 4M2P = 100 | Good | Good | Good | Good | 85 nm | rectangular | 80 nm | rectangular |
| 60 | A-14 | 4M2P = 100 | Good | Good | Good | Good | 85 nm | rectangular | 80 nm | rectangular |
| 61 | A-15 | 4M2P/B = 50/50 | Good | Good | Good | Good | 85 nm | rectangular | 80 nm | rectangular |
| 62 | A-16 | 4M2P/B = 50/50 | Good | Good | Good | Good | 85 nm | rectangular | 80 nm | rectangular |
| 63 | A-17 | 4M2P = 100 | Good | Good | Good | Good | 85 nm | rectangular | 80 nm | rectangular |
| 64 | A-18 | 4M2P = 100 | Good | Good | Good | Good | 85 nm | rectangular | 80 nm | rectangular |

TABLE 3-continued

| | Copolymer | Solvent | Solubility | Removability | Intermixing | Water Resistance | Evaluation of patterning 1 | | Evaluation of patterning 2 | |
|---|---|---|---|---|---|---|---|---|---|---|
| | | | | | | | Resolution | Configuration | Resolution | Configuration |
| 65 | A-19 | 4M2P = 100 | Good | Good | Good | Good | 85 nm | rectangular | 80 nm | rectangular |
| 66 | A-20 | 4M2P = 100 | Good | Good | Good | Good | 85 nm | rectangular | 80 nm | rectangular |
| 67 | A-21 | 4M2P = 100 | Good | Good | Good | Good | 85 nm | rectangular | 80 nm | rectangular |
| 68 | A-22 | 4M2P = 100 | Good | Good | Good | Good | 85 nm | rectangular | 80 nm | rectangular |
| 69 | A-23 | 4M2P = 100 | Good | Good | Good | Good | 85 nm | rectangular | 80 nm | rectangular |
| 70 | A-24 | 4M2P = 100 | Good | Good | Good | Good | 85 nm | rectangular | 80 nm | rectangular |
| 71 | A-25 | 4M2P = 100 | Good | Good | Good | Good | 85 nm | rectangular | 80 nm | rectangular |
| 72 | A-26 | 4M2P = 100 | Good | Good | Good | Good | 85 nm | rectangular | 80 nm | rectangular |
| 73 | A-27 | 4M2P = 100 | Good | Good | Good | Good | 85 nm | rectangular | 80 nm | rectangular |
| 74 | A-28 | 4M2P = 100 | Good | Good | Good | Good | 85 nm | rectangular | 80 nm | rectangular |
| 75 | A-29 | 4M2P = 100 | Good | Good | Good | Good | 85 nm | rectangular | 80 nm | rectangular |
| 76 | A-30 | 4M2P = 100 | Good | Good | Good | Good | 85 nm | rectangular | 80 nm | rectangular |
| 77 | A-31 | 4M2P = 100 | Good | Good | Good | Good | 85 nm | rectangular | 80 nm | rectangular |
| 78 | A-32 | 4M2P = 100 | Good | Good | Good | Good | 85 nm | rectangular | 80 nm | rectangular |
| 79 | A-33 | 4M2P = 100 | Good | Good | Good | Good | 85 nm | rectangular | 80 nm | rectangular |
| 80 | A-34 | 4M2P = 100 | Good | Good | Good | Good | 85 nm | rectangular | 80 nm | rectangular |
| 81 | A-35 | 4M2P = 100 | Good | Good | Good | Good | 85 nm | rectangular | 80 nm | rectangular |
| 82 | A-36 | 4M2P = 100 | Good | Good | Good | Good | 85 nm | rectangular | 80 nm | rectangular |
| 83 | A-37 | 4M2P = 100 | Good | Good | Good | Good | 85 nm | rectangular | 80 nm | rectangular |
| 84 | A-38 | 4M2P = 100 | Good | Good | Good | Good | 85 nm | rectangular | 80 nm | rectangular |
| 85 | A-39 | 4M2P = 100 | Good | Good | Good | Good | 85 nm | rectangular | 80 nm | rectangular |
| 86 | A-40 | 4M2P = 100 | Good | Good | Good | Good | 85 nm | rectangular | 80 nm | rectangular |
| 87 | A-41 | 4M2P = 100 | Good | Good | Good | Good | 85 nm | rectangular | 80 nm | rectangular |
| 88 | A-42 | 4M2P = 100 | Good | Good | Good | Good | 85 nm | rectangular | 80 nm | rectangular |
| 89 | A-43 | 4M2P = 100 | Good | Good | Good | Good | 85 nm | rectangular | 80 nm | rectangular |
| 90 | A-44 | 4M2P = 100 | Good | Good | Good | Good | 85 nm | rectangular | 80 nm | rectangular |
| 91 | A-45 | 4M2P = 100 | Good | Good | Good | Good | 85 nm | rectangular | 80 nm | rectangular |
| 92 | A-46 | 4M2P = 100 | Good | Good | Good | Good | 85 nm | rectangular | 80 nm | rectangular |
| Comparative Example | | | | | | | | | | |
| 3 | C-1 | 4M2P/B = 50/50 | Good | Good | Good | Good | 90 nm | head-projected | 90 nm | head-projected |
| 4 | C-2 | 4M2P = 100 | Good | Good | Good | Good | 90 nm | head-projected | 90 nm | head-projected |
| 5 | — | — | — | — | — | — | 85 nm | rectangular | 80 nm | rectangular |

INDUSTRIAL APPLICABILITY

Because the copolymer of the present invention is dissolvable both in a solvent containing a monohydric alcohol and in an alkaline developer, the composition can be easily applied to a photoresist film. The top coat which can protect a lens and resist and can form a resist pattern excelling in resolution, developability, and the like in immersion lithography, particularly in immersion lithography using water as a medium, can be obtained. Therefore, the composition can be extremely suitably used for manufacturing semiconductor devices, which are expected to become more and more minute.

BRIEF DESCRIPTION OF THE DRAWINGS

FIG. 1 is a cross-sectional view of a line- and space pattern.

EXPLANATION OF REFERENCE NUMERALS AND SYMBOLS

1: a substrate
2: a pattern

What is claimed is:

1. A top coating composition coated on a photoresist film for forming a pattern by applying radiation, the composition comprising at least one solvent selected from the group consisting of n-butanol and 4-methyl-2-pentanol; a non-photosensitive copolymer comprising a recurring unit (I) shown by the following formula (1a) and a recurring unit (II) having a sulfo group, the copolymer having a weight average molecular weight determined by gel permeation chromatography of 2,000 to 100,000, the copolymer being scarcely dissolved in water,

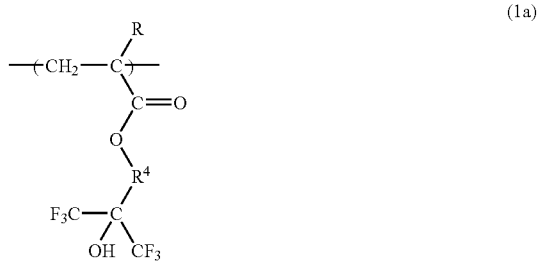

(1a)

wherein R represents a hydrogen atom, a methyl group, a hydroxymethyl group, or a trifluoromethyl group, and $R^4$ represents a divalent hydrocarbon group.

2. A top coating composition coated on a photoresist film for forming a pattern by applying radiation, the composition comprising at least one solvent selected from the group consisting of n-butanol and 4-methyl-2-pentanol; a non-photosensitive copolymer comprising a recurring unit (I) shown by the following formula (2a) and a recurring unit (II) having a sulfo group, the copolymer having a weight average molecular weight determined by gel permeation chromatography of 2,000 to 100,000, the copolymer being scarcely dissolved in water,

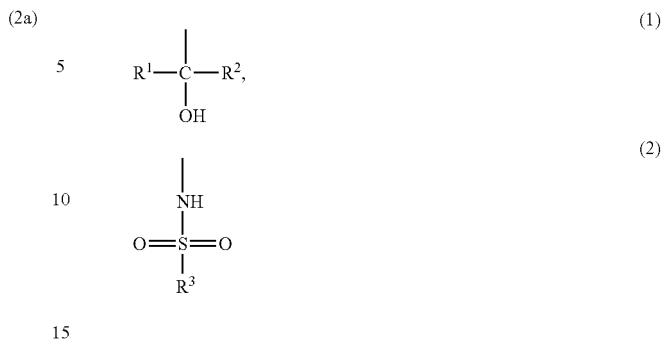

(1)

(2)

wherein $R^1$ and $R^2$ in the formula (1) individually represent a hydrogen atom, an alkyl group having 1 to 4 carbon atoms, or a fluoroalkyl group having 1 to 4 carbon atoms, provided that at least one of $R^1$ and $R^2$ is a fluoroalkyl group having 1 to 4 carbon atoms, and $R^3$ in the formula (2) represents a fluoroalkyl group having 1 to 20 carbon atoms, wherein the recurring unit (II) having a sulfo group is produced by the radial copolymerizable monomer represented by the following formula (3),

(3)

wherein R represents a hydrogen atom, a methyl group, a hydroxymethyl group, or a trifluoromethyl group, A represents a single bond, a carbonyl group, a carbonyloxy group, an oxy carbonyl group, and B represents a single bond or a divalent organic group having 1 to 20 carbon atoms.

7. The top coating composition according to claim 6, wherein the ratio of monomers is such that the value of [mol % of the recurring unit (IA) having a group shown by the formula (1)]/60 [mol % of the recurring unit (IB) having a group shown by the formula (2)]/40 [mol % of the recurring unit (IC) having a carboxyl group]/25 is 0.7 or more.

8. A top coating composition coated on a photoresist film for forming a pattern by applying radiation, the composition comprising at least one solvent selected from the group consisting of n-butanol and 4-methyl-2-pentanol; a non-photosensitive copolymer comprising a recurring unit (IA) having a group shown by the following formula (1), a recurring unit (IB) having a group shown by the following formula (2), a recurring unit (IC) having a carboxyl group, and a recurring unit (II) having a sulfo group, the copolymer having a weight average molecular weight determined by gel permeation chromatography of 2,000 to 100,000,

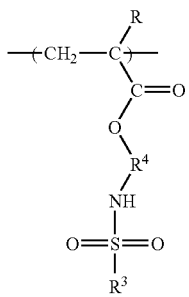

(2a)

wherein R represents a hydrogen atom, a methyl group, a hydroxymethyl group, or a trifluoromethyl group, $R^3$ represents a fluoroalkyl group having 1 to 20 carbon atoms, and $R^4$ is an ethylene group.

3. The top coating composition according to claim 1 or 2, wherein the recurring unit (II) having a sulfo group is produced by the radial copolymerizable monomer represented by the following formula (3),

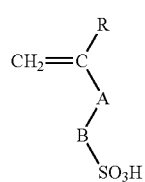

(3)

wherein R represents a hydrogen atom, a methyl group, a hydroxymethyl group, or a trifluoromethyl group, A represents a single bond, a carbonyl group, a carbonyloxy group, an oxy carbonyl group, and B represents a single bond or a divalent organic group having 1 to 20 carbon atoms.

4. The top coating composition coated on a photoresist film for forming a pattern by applying radiation according to claim 1 or 2, wherein the top coating composition is suitable for use in liquid immersion lithography.

5. The top coating composition according to claim 1 or 2, wherein the copolymer is soluble in a developer for the photoresist film after exposure radiation to form a resist pattern.

6. A top coating composition coated on a photoresist film for forming a pattern by applying radiation, the composition comprising at least one solvent selected from the group consisting of n-butanol and 4-methyl-2-pentanol; a non-photosensitive copolymer comprising a recurring unit (IA) having a group shown by the formula (1), a recurring unit (IB) having a group shown by the formula (2), a recurring unit (IC) having a carboxyl group and a recurring unit (II) having a sulfo group, the copolymer having a weight average molecular weight determined by gel permeation chromatography of 2,000 to 100,000, the copolymer being scarcely dissolved by water,

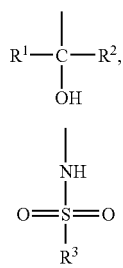

(1)

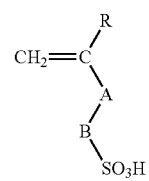

(3)

(2)

wherein R represents a hydrogen atom, a methyl group, a hydroxymethyl group, or a trifluoromethyl group, A represents a single bond, a carbonyl group, a carbonyloxy group, an oxy carbonyl group, and B represents a single bond or a divalent organic group having 1 to 20 carbon atoms.

wherein $R^1$ and $R^2$ in the formula (1) individually represent a hydrogen atom, an alkyl group having 1 to 4 carbon atoms, or a fluoroalkyl group having 1 to 4 carbon atoms, provided that at least one of $R^1$ and $R^2$ is a fluoroalkyl group having 1 to 4 carbon atoms, and $R^3$ in the formula (2) represents a fluoroalkyl group having 1 to 20 carbon atoms, wherein the recurring unit (II) having a sulfo group is produced by the radial copolymerizable monomer represented by the following formula (3), 9. The top coating composition according to claim 8, wherein the ratio of monomers is such that the value of [mol % of the recurring unit (IA) having a group shown by the formula (1)]/60+[mol % of the recurring unit (IB) having a group shown by the formula (2)]/40+[mol % of the recurring unit (IC) having a carboxyl group]/25 is 0.7 or more.

* * * * *